United States Patent
Chrysler et al.

(10) Patent No.: US 7,851,905 B2
(45) Date of Patent: Dec. 14, 2010

(54) MICROELECTRONIC PACKAGE AND METHOD OF COOLING AN INTERCONNECT FEATURE IN SAME

(75) Inventors: Gregory M. Chrysler, Chandler, AZ (US); Ravi V. Mahajan, Tempe, AZ (US); Chia-Pin Chiu, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 521 days.

(21) Appl. No.: 11/861,306

(22) Filed: Sep. 26, 2007

(65) Prior Publication Data

US 2009/0079063 A1 Mar. 26, 2009

(51) Int. Cl.
*H01L 23/34* (2006.01)
*H01L 23/48* (2006.01)

(52) U.S. Cl. .......... 257/712; 257/778; 257/930; 257/E23.082; 257/713

(58) Field of Classification Search .......... 257/930, 257/778, 712, E23.082
See application file for complete search history.

(56) References Cited

U.S. PATENT DOCUMENTS

| | | | |
|---|---|---|---|
| 6,043,423 A * | 3/2000 | Satomura et al. | 136/211 |
| 6,121,539 A * | 9/2000 | Johnson et al. | 136/203 |
| 6,127,619 A * | 10/2000 | Xi et al. | 136/203 |
| 6,154,366 A | 11/2000 | Ma et al. | |
| 6,271,469 B1 | 8/2001 | Ma et al. | |
| 6,388,185 B1 * | 5/2002 | Fleurial et al. | 136/205 |
| 6,423,570 B1 | 7/2002 | Ma et al. | |
| 6,489,185 B1 | 12/2002 | Towle et al. | |
| 6,489,551 B2 * | 12/2002 | Chu et al. | 136/230 |
| 6,555,906 B2 | 4/2003 | Towle et al. | |
| 6,586,276 B2 | 7/2003 | Towle et al. | |
| 6,586,822 B1 | 7/2003 | Vu et al. | |
| 6,586,836 B1 | 7/2003 | Ma et al. | |
| 6,617,682 B1 | 9/2003 | Ma et al. | |
| 6,706,553 B2 | 3/2004 | Towle et al. | |
| 6,709,898 B1 | 3/2004 | Ma et al. | |
| 6,713,859 B1 | 3/2004 | Ma | |
| 6,734,534 B1 | 5/2004 | Vu et al. | |
| 6,794,223 B2 | 9/2004 | Ma et al. | |
| 6,825,063 B2 | 11/2004 | Vu et al. | |
| 6,841,413 B2 | 1/2005 | Liu et al. | |
| 6,888,240 B2 | 5/2005 | Towle et al. | |
| 6,894,399 B2 | 5/2005 | Vu et al. | |
| 6,902,950 B2 | 6/2005 | Ma et al. | |
| 6,964,889 B2 | 11/2005 | Ma et al. | |
| 6,981,380 B2 | 1/2006 | Chrysler et al. | |
| 7,067,356 B2 | 6/2006 | Towle et al. | |
| 7,071,024 B2 | 7/2006 | Towle et al. | |
| 7,078,788 B2 | 7/2006 | Vu et al. | |
| 7,183,658 B2 | 2/2007 | Towle et al. | |
| 7,189,596 B1 | 3/2007 | Mu et al. | |
| 7,416,918 B2 | 8/2008 | Ma | |
| 7,420,273 B2 | 9/2008 | Liu et al. | |
| 2003/0034564 A1 * | 2/2003 | Palanisamy et al. | 257/778 |
| 2003/0122245 A1 * | 7/2003 | Chu et al. | 257/706 |
| 2004/0000333 A1 * | 1/2004 | Chen et al. | 136/224 |
| 2004/0262745 A1 * | 12/2004 | Cordes et al. | 257/713 |
| 2007/0125413 A1 * | 6/2007 | Olsen et al. | 136/205 |
| 2007/0194465 A1 | 8/2007 | Dai | |

* cited by examiner

*Primary Examiner*—Nitin Parekh
(74) *Attorney, Agent, or Firm*—Kenneth A. Nelson

(57) ABSTRACT

A microelectronic package comprises a substrate (110, 310), a die (320) supported by the substrate, an interconnect feature (130, 230, 330) connecting the die and the substrate to each other, and a thermoelectric cooler (140, 170, 240, 340) adjacent to the interconnect feature.

16 Claims, 3 Drawing Sheets

MICROELECTRONIC PACKAGE AND METHOD OF COOLING AN INTERCONNECT FEATURE IN SAME

FIELD OF THE INVENTION

The disclosed embodiments of the invention relate generally to microelectronic packaging, and relate more particularly to the cooling of features within a microelectronic package.

BACKGROUND OF THE INVENTION

Interconnect structures that connect a die to a package substrate are traditionally known as first level interconnect structures, or simply FLI, and typically include a solder material. First level interconnect life is a function of the current passing through the solder and of the temperature of the connections. High current density in FLI results in high local temperatures and diminished life due to electromigration in the solder bonds. Methods of extending the life of the interconnect structures include either reducing the temperature or reducing the current. Unfortunately, the advance of technology is reducing the size of the interconnect without a commensurate reduction in the current, a combination that results in increased temperature at FLI and projected shortened life.

BRIEF DESCRIPTION OF THE DRAWINGS

The disclosed embodiments will be better understood from a reading of the following detailed description, taken in conjunction with the accompanying figures in the drawings in which.

Figure 1:
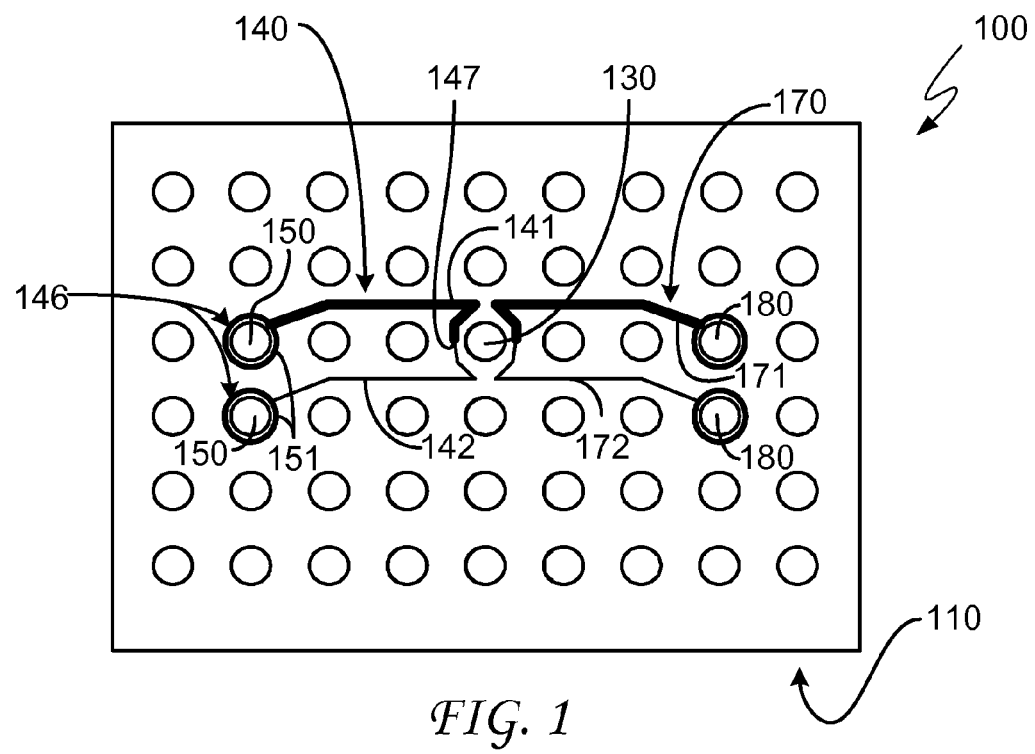
FIG. 1 is a plan view of a portion of a microelectronic package according to an embodiment of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION OF THE DRAWINGS

In one embodiment of the invention, a microelectronic package comprises a substrate, a die supported by the substrate, an interconnect feature connecting the die and the substrate to each other, and a thermoelectric cooler adjacent to the interconnect feature. An embodiment of the invention thus provides thermoelectric cooling for first level interconnects. The thermoelectric coolers may be built up in the substrate during a bumpless-build-up layer (BBUL) process, placed either on the die active side or on the top of the substrate, or embedded in a package as part of a package build-up process. Powering of the TEC results in movement of thermal energy from high current (and thus hotter) areas to lower current (cooler) areas across the die or substrate surface.

Embodiments of the invention provide a means of reducing, on a local level, the temperature at the FLI. As suggested above, particular embodiments place a small, thin thermoelectric cooler in either the build-up layers of a BBUL substrate, on the top layer of a substrate, or on the active side of the die, in order to take thermal energy from a bump carrying high electric currents (or generating high levels of heat for some other reason) and deposit that energy at a location some distance away. Possible recipients of the thermal energy are metal layers (good thermal spreaders) in the substrate, or a lower-temperature bump or via between the die and the substrate. The small amount of power needed to run the TEC can be drawn directly from the power planes in the substrate or from a power via and/or a power bump.

Cooling the higher temperature spots in the FLI may allow increased interconnect lifetimes at fixed current levels or allow higher currents for the same lifetimes. By enabling local temperature reductions, embodiments of the invention increase opportunities to add processor performance, such as enabling more turbo modes, deferring core hopping events, and the like. As electromigration limits are possibly the primary limiters to current microprocessor architectures, embodiments of the invention (by allowing such higher currents and/or longer lifetimes) may expand and enhance the available opportunities in such architectures.

Referring now to the drawings, FIG. 1 is a plan view of a portion of a microelectronic package 100 according to an embodiment of the invention. As illustrated in FIG. 1, microelectronic package 100 comprises a substrate 110, a die (not shown in FIG. 1) supported by substrate 110, an interconnect feature 130 that connects the die and substrate 110 to each other, and a thermoelectric cooler 140 adjacent to interconnect feature 130.

In the embodiment illustrated in FIG. 1, interconnect feature 130 is a solder bump such as is commonly used to form an electrical connection between a silicon die and its package. As such, interconnect feature 130 is an example of what is typically referred to as a first level interconnect, or FLI, as explained above. Also in FIG. 1, thermoelectric cooler 140 is located on substrate 110 around and/or between substrate solder bumps (i.e., interconnect feature 130 and neighboring bumps that are also FLI bumps). Interconnect feature 130 is an interconnect that requires cooling. As an example, interconnect feature 130 can be a bump that carries or is subjected to high current levels or that has an elevated temperature for some other reason. Interconnect feature 130 is thus sometimes referred to as a "hot bump."

Thermoelectric cooler 140 comprises a thermoelectric element 141 comprising a first semiconducting material and a thermoelectric element 142 comprising a second semiconducting material. In FIG. 1, thermoelectric element 141 is depicted with a thick line while thermoelectric element 142 is depicted with a much thinner line. This, however, is merely an artifice designed to highlight the existence of the two separate thermoelectric elements and does not necessarily indicate actual or relative thicknesses of thermoelectric elements 141 and 142.

One of thermoelectric elements 141 and 142 is a P-type element and the other is an N-type element. As shown, and as further discussed below, the P-type and N-type thermoelectric elements 141 and 142 of thermoelectric cooler 140 are connected together to form a cooled junction 147 next to interconnect feature 130 (the bump that is to be cooled). The opposite end(s) of thermoelectric elements 141 and 142 are thermally and electrically connected, at a heated junction 146, to a positive and a negative power plane that are at a lower temperature than interconnect feature 130. (The power planes are not shown in FIG. 1.)

The connection between heated junction 146 and the power planes is indicated in FIG. 1 by circles 151 surrounding interconnect features 150. Interconnect features 150 are electrically and thermally connected to the power planes of microelectronic package 100; one of interconnect features 150 is connected to the positive power plane and the other one of interconnect features 150 is connected to the negative power plane. In this fashion heated junction 146 is formed in a manner that cools interconnect feature 130.

In a non-illustrated embodiment, with cooled junction 147 still adjacent to interconnect feature 130, heated junction 146 of thermoelectric cooler 140 is connected to a second interconnect feature that has a lower temperature than a temperature of interconnect feature 130. In a different non-illustrated embodiment, heated junction 146 is connected to a power plane and a ground plane instead of to two power planes. With the voltage difference between the two planes being known, the thickness, length, and/or other dimensions of thermoelectric cooler 140 may be adjusted in order to provide an appropriate current needed for the desired cooling.

The efficiency and effectiveness of thermoelectric cooler 140 increases with increasing temperature differences between interconnect feature 130 and the planes to which the opposite end(s) are connected. This efficiency and effectiveness may be further enhanced where the two planes are at the same temperature as each other (but this is not a requirement for thermoelectric cooler 140).

In one embodiment, the first semiconducting material (of thermoelectric element 141) comprises bismuth telluride (BiTe) doped with selenium (N-type) and the second semiconducting material (of thermoelectric element 142) comprises BiTe doped with antimony (P-type). In another embodiment lead (Pb) may be used in place of bismuth. BiTe materials in particular are widely used in thermoelectric coolers, and are especially well-suited for operation at or near room temperature. PbTe materials, in contrast, may be better for operation at higher temperatures.

In another embodiment, thermoelectric element 141 comprises a first metallic material and thermoelectric element 142 comprises a second metallic material. (The metallic material of thermoelectric elements 141 and 142 can include metal alloys.) As an example, the first metallic material may be a P-type material such as copper, iron, or chromel and the second metallic material may be an N-type material such as constantan or alumel.

A very common thermocouple type known as a type T thermocouple is composed of copper and constantan. Type T thermocouples have a useful application range of approximately −250 to approximately 350 degrees Celsius. As suggested above, type T thermocouples may be useful in some embodiments of the invention. Some additional thermocouple types that are widely used are type E (chromel and constantan), type J (iron and constantan), and type K (chromel and alumel). Thermocouples of types E, J, and K, (among other types that are not described herein), may also be useful in particular embodiments. Type E thermocouples have a useful application range of approximately −200 to approximately 900 degrees Celsius, while the useful application ranges for types J and K, respectively, are approximately 0 to approximately 750 degrees Celsius and approximately −200 to approximately 1250 degrees Celsius. In general, better heat conductors tend to make better thermoelectric elements, at least for some embodiments of the invention, because embodiments of the invention pump heat from regions of higher temperature to regions of lower temperature.

In one embodiment, thermoelectric cooler 140 is a fine line thermoelectric cooler, or fine line TEC, so called because of the large aspect ratio of thermoelectric elements 141 and 142. As an example, thermoelectric elements 141 and 142 may each have an aspect ratio of at least 30:1 and perhaps as high as 80:1 or larger. In one embodiment, these aspect ratios are achieved, respectively, by thermoelectric elements 141 and 142 having lengths of, respectively, approximately 750 micrometers and at least approximately 2000 micrometers, and heights of approximately 25 micrometers. In the same or another embodiment, thermoelectric element 141 and thermoelectric element 142 have heights and widths that are both approximately 25 micrometers, resulting in a cross-sectional area of between approximately 600 and approximately 700 square micrometers.

A typical package carries solder bumps having a pitch of approximately 175 micrometers. A thermoelectric cooler according to embodiments of the invention would therefore require thermoelectric elements or traces sized to fit within the spaces created by such a pitch. A trace having a size of 25 micrometers by 25 micrometers is an example of a size that would work well, although other dimensions would also be suitable. Regarding the size of the traces, it should be noted that thicker traces both equate to a smaller $I^2R$ term and can conduct more heat, so that for at least some embodiments thicker traces may be preferred over thinner ones (provided the thicker traces can fit within the available space between solder bumps).

Consider now a single fine line TEC having dimensions as described above, or some other combination of width and height (thickness), resulting in a cross-sectional area of approximately 625 square micrometers. Consider further that a typical bump has an electrical resistance of 1.5 to 1.8 mOhm. With an Imax of 350 mA, the $I^2R$ power dissipated in the bump could be in the neighborhood of 0.23 mW. As has already been discussed, this electrical dissipation power can result in high local temperatures at the bump/interconnect, but removal of that power may reduce the temperature of the bump and extend FLI life.

The table below shows heat removal capabilities (measured in milliwatts) of a single fine line TEC of said cross-sectional area at various transmission lengths L (measured in micrometers (μm)) and for a temperature reduction of 10 degrees Celsius. The table was generated from standard TEC equations and assumes only bulk TEC properties of standard BiTe materials. Advances in TEC materials (e.g., superlattice materials) may extend the distance the power could be moved.

| L (μm) | Qc (mW) |
|---|---|
| 750 | 0.345 |
| 1000 | 0.259 |
| 1250 | 0.207 |
| 1500 | 0.173 |
| 1750 | 0.148 |
| 2000 | 0.129 |

Keeping in mind the 0.23 mW power dissipation noted above, it may be seen from the table that a single fine line TEC can remove the $I^2R$ power by a distance of approximately 1 mm while reducing the bump temperature by 10 C. If a greater distance is required, then two fine line TECs could move the power 2 mm (i.e., twice as far) while still reducing the temperature by 10 C.

Referring still to FIG. 1, microelectronic package 100 further comprises a thermoelectric cooler 170 having a thermoelectric element 171 and a thermoelectric element 172. As an example, thermoelectric cooler 170 and thermoelectric elements 171 and 172 can be similar to, respectively, thermoelectric cooler 140 and thermoelectric elements 141 and 142. In order to simply the drawing, further components of this second thermoelectric cooler are not specifically indicated with reference lines or reference numerals, but such components are similar to corresponding components of thermoelectric cooler 140.

It may be seen that, as was the case for thermoelectric cooler 140, a heated junction of thermoelectric cooler 170 is formed at interconnect features 180 which, like interconnect features 150, are electrically and thermally connected to the power planes of microelectronic package 100 in the same manner as that described above for heated junction 146 of thermoelectric cooler 140. As mentioned above, adding a second thermoelectric cooler enables the $I^2R$ power to be moved over a distance twice as great as it could be moved by a single thermoelectric cooler acting alone.

The number of thermocouples needed to remove the heat, and reduce the bump or interconnect temperature by an appropriate amount, depends on the distance the heat must be moved. In embodiments requiring even more heat removal than is possible using two TECs, multiple TECs, or multiple layers of TEC, could be deposited/plated or otherwise placed adjacent to the hot bump. As an example, FIG. 2 is a plan view depicting a possible configuration of a portion of a microelectronic package 200 that places four thermoelectric coolers adjacent to a hot bump according to an embodiment of the invention.

Figure 2:
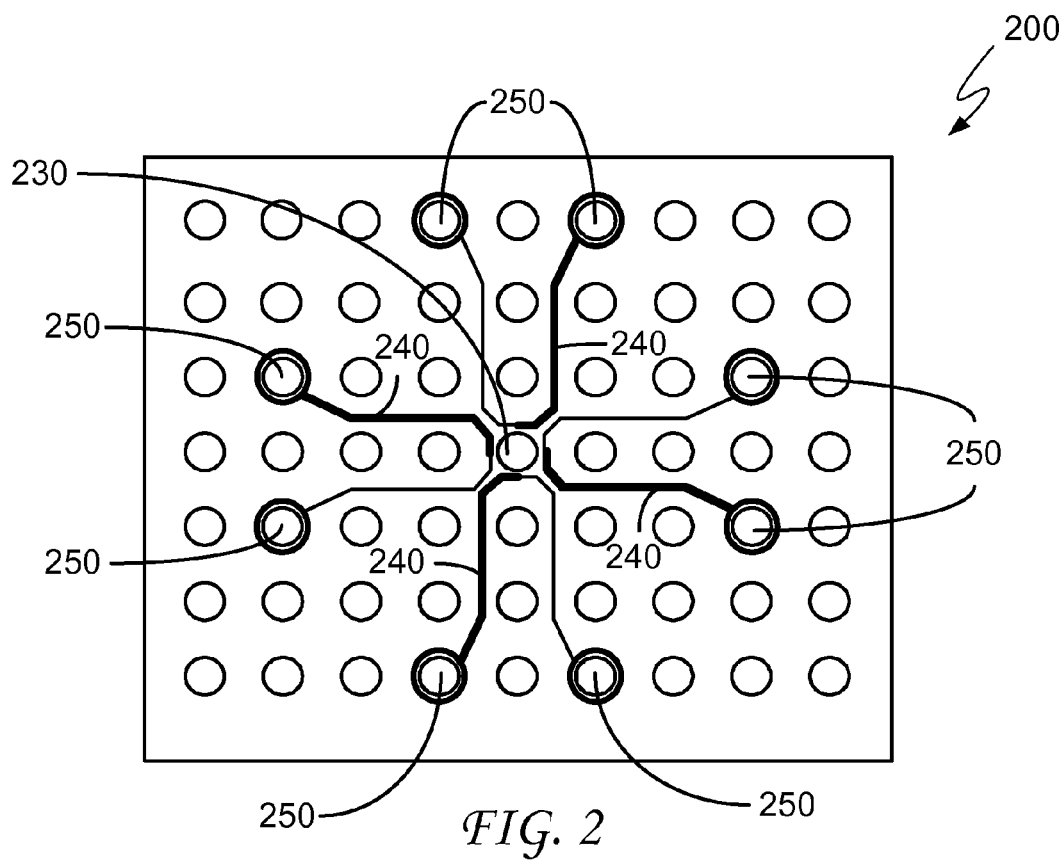
FIG. 2 is a plan view depicting a portion of a microelectronic package according to a different embodiment of the invention.

As illustrated in FIG. 2, microelectronic package 200 comprises a "hot" interconnect feature 230, multiple thermoelectric coolers 240, and interconnect features 250. Interconnect feature 230, thermoelectric coolers 240, and interconnect features 250, including their various components, junctions, and connections, can be similar to, respectively, interconnect feature 130, thermoelectric cooler 140, and interconnect features 150, all of which are shown in FIG. 1.

Not illustrated in the figures, but existing as a possible addition to a thermoelectric cooler or to a microelectronic package according to an embodiment of the invention, is a control element or elements capable of turning the TECs on and off as needed and as triggered by high current events or the like. Such control elements would help conserve battery life and also reduce the overall thermal problem.

Figure 3:
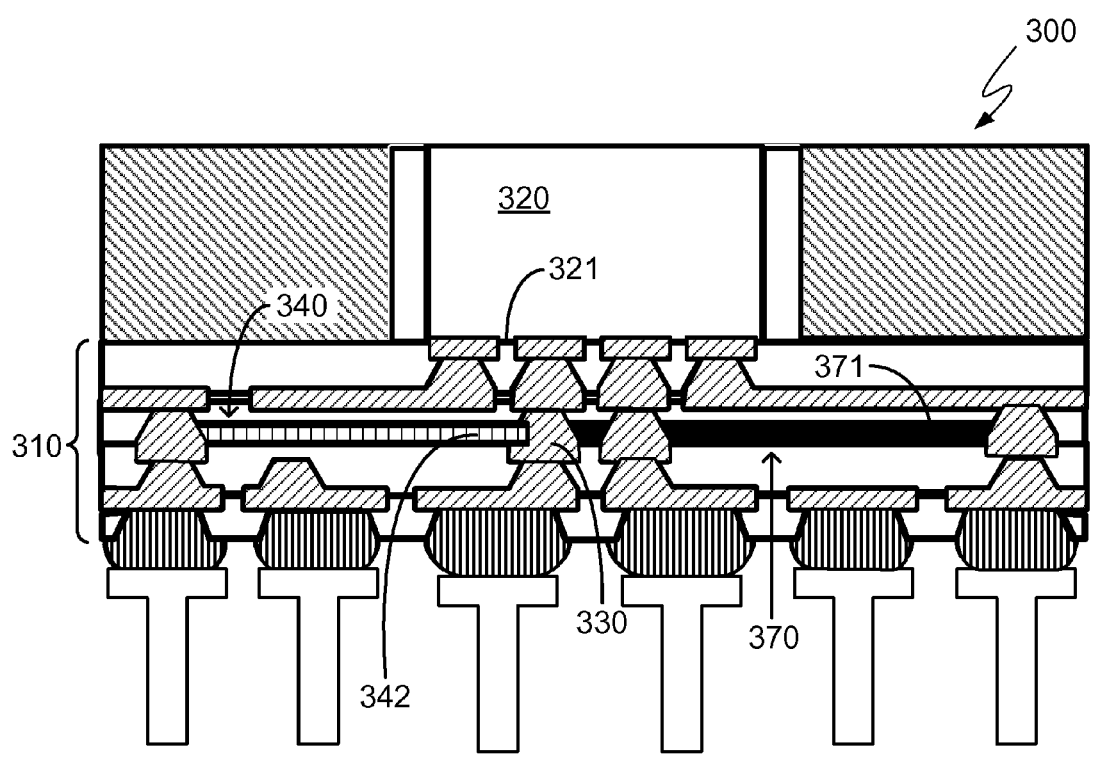
FIG. 3 is a cross-sectional view of a portion of a microelectronic package according to an embodiment of the invention.

FIG. 3 is a cross-sectional view of a portion of a microelectronic package 300 according to an embodiment of the invention. As illustrated in FIG. 3, microelectronic package 300 is a BBUL package that comprises a substrate 310 (in the form of a plurality of BBUL interconnect layers), a die 320 supported by substrate 310, an interconnect feature 330 connecting die 320 and substrate 310 to each other, and thermoelectric coolers 340 and 370 adjacent to interconnect feature 330. As an example, interconnect feature 330, thermoelectric cooler 340, and thermoelectric cooler 370 can be similar to, respectively, interconnect feature 130, thermoelectric cooler 140, and thermoelectric cooler 170, all of which are shown in FIG. 1. Note that in FIG. 3, a thermoelectric element 342 of thermoelectric cooler 340 (corresponding to thermoelectric element 142 of thermoelectric cooler 140) is shown, while a thermoelectric element corresponding to thermoelectric element 141 of thermoelectric cooler 140 is obscured behind thermoelectric element 342, and thus is not visible in FIG. 3. In contrast, for thermoelectric cooler 370 a thermoelectric element corresponding to thermoelectric element 172 is not shown so that a thermoelectric element 371 (corresponding to thermoelectric element 171 of thermoelectric cooler 170) may be seen.

In the embodiment illustrated in FIG. 3, interconnect feature 330 is a via that is connected to a hot (high temperature) solder bump or other hot FLI structure. As shown, thermoelectric cooler 340 is embedded within a layer of bumpless build-up layer substrate 310. In a non-illustrated embodiment the thermoelectric cooler is located on an active side of the die, similar to an active side 321 of die 320, such that it is located around and/or between copper bumps or the equivalent on that side of the die.

Figure 4:
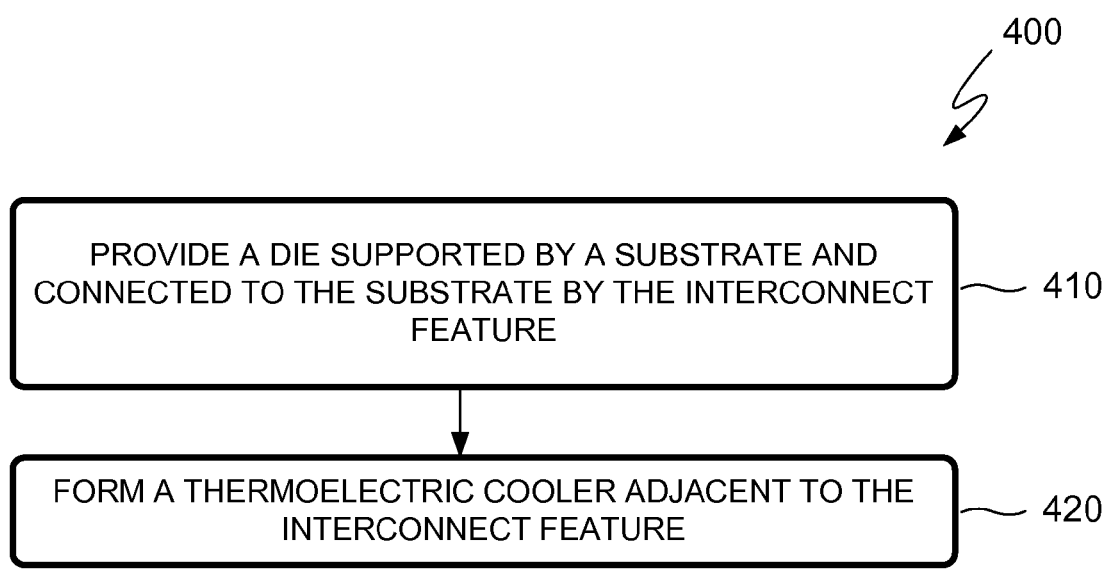
FIG. 4 is a flowchart illustrating a method of cooling an interconnect feature in a microelectronic package according to an embodiment of the invention.

FIG. 4 is a flowchart illustrating a method 400 of cooling an interconnect feature in a microelectronic package according to an embodiment of the invention. A step 410 of method 400 is to provide a die supported by a substrate and connected to the substrate by the interconnect feature. As an example, the die can be similar to die 320 that is shown in FIG. 3. As another example, the substrate can be similar to substrate 110 or to substrate 310, shown, respectively, in FIGS. 1 and 3. As yet another example, the interconnect feature can be similar to interconnect feature 130 that is shown in FIG. 1.

A step 420 of method 400 is to form a thermoelectric cooler adjacent to the interconnect feature. As an example, the thermoelectric cooler can be similar to thermoelectric cooler 140 that is shown in FIG. 1. In one embodiment, step 420 comprises providing a first thermoelectric element and a second thermoelectric element and further comprises joining the first thermoelectric element and the second thermoelectric element together. In a particular embodiment, the first and second thermoelectric elements are joined together with epoxy or by using a welding operation, a soldering operation, or the like. In a different particular embodiment, the first and second thermoelectric elements are joined together using a plating technique. As an example, the first thermoelectric element and the second thermoelectric element can be similar to, respectively, thermoelectric element 141 and thermoelectric element 142, both of which are shown in FIG. 1.

In the same or another embodiment, step 420 comprises providing the first thermoelectric element and the second thermoelectric element, joining the first thermoelectric element and the second thermoelectric element together in order to form a cooled junction of the thermoelectric cooler adjacent to the interconnect feature, and electrically and thermally connecting a heated junction of the thermoelectric cooler to a power plane of the microelectronic package.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the microelectronic package and related components and methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A microelectronic package comprising:
a substrate;
a die supported by the substrate;
a first interconnect feature that requires cooling, the first interconnect feature being one of a plurality of interconnect features connecting the die and the substrate to each other; and
a thermoelectric cooler adjacent to the first interconnect feature, wherein the thermoelectric cooler is coplanar with and located between at least two of the interconnect features.

2. The microelectronic package of claim 1 wherein:
the thermoelectric cooler has a heated junction and a cooled junction, with the cooled junction adjacent to the first interconnect feature;
the microelectronic package further comprises a power plane; and
the heated junction is electrically and thermally connected to the power plane of the microelectronic package.

3. The microelectronic package of claim 1 wherein:
the thermoelectric cooler has a heated junction and a cooled junction, with the cooled junction adjacent to the first interconnect feature;
the microelectronic package further comprises a second interconnect feature that has a lower temperature than a temperature of the first interconnect feature; and
the heated junction is thermally connected to the second interconnect feature of the microelectronic package.

4. The microelectronic package of claim 1 wherein:
the thermoelectric cooler comprises a first thermoelectric element comprising a first semiconducting material and a second thermoelectric element comprising a second semiconducting material.

5. The microelectronic package of claim 4 wherein:
at least one of the first semiconducting material and the second semiconducting material comprises bismuth telluride.

6. The microelectronic package of claim 1 wherein:
the thermoelectric cooler comprises a first thermoelectric element comprising a comprising a first metallic material and a second thermoelectric element comprising a second metallic material.

7. The microelectronic package of claim 6 wherein:
the first metallic material is one of copper, iron, and chromel and the second metallic material is one of constantan and alumel.

8. The microelectronic package of claim 1 wherein:
the first interconnect feature is a solder bump.

9. The microelectronic package of claim 1 wherein:
the first interconnect feature is a via.

10. The microelectronic package of claim 1 wherein:
the substrate comprises a plurality of build-up layers built up over and around the die; and
the thermoelectric cooler is embedded within one or more of the build-up layers.

11. The microelectronic package of claim 1 wherein:
the thermoelectric cooler is located on the substrate.

12. The microelectronic package of claim 1 wherein:
the die has an active side; and
the thermoelectric cooler is located on the active side of the die.

13. A microelectronic package comprising:
a substrate;
a die supported by the substrate;
a first interconnect feature that requires cooling, the first interconnect feature being one of a plurality of interconnect features connecting the die and the substrate to each other; and
a fine line thermoelectric cooler adjacent to the first interconnect feature,
wherein:
the fine line thermoelectric cooler is coplanar with and located between at least two of the interconnect features;
the fine line thermoelectric cooler comprises a first thermoelectric element and a second thermoelectric element; and
the first thermoelectric element and the second thermoelectric element each have an aspect ratio of at least 30:1.

14. The microelectronic package of claim 13 wherein:
the first thermoelectric element and the second thermoelectric element each have a cross-sectional area of between approximately 600 and 700 square micrometers.

15. The microelectronic package of claim 13 wherein:
the fine line thermoelectric cooler has a heated junction and a cooled junction, with the cooled junction adjacent to the first interconnect feature;
the microelectronic package further comprises a power plane; and
the heated junction is electrically and thermally connected to the power plane of the microelectronic package.

16. The microelectronic package of claim 15 wherein:
the first thermoelectric element comprises a first metallic material and the second thermoelectric element comprises a second metallic material.

\* \* \* \* \*